United States Patent [19]

Golda et al.

[11] 4,104,072

[45] Aug. 1, 1978

[54] WATER DEVELOPABLE LITHOGRAPHIC PRINTING PLATE HAVING DUAL PHOTOSENSITIVE LAYERING

[75] Inventors: Eugene Golda, Monsey; Alan Leonard Wilkes, Brewster; Simon Long Chu, Dobbs Ferry, all of N.Y.

[73] Assignee: Polychrome Corporation, Yonkers, N.Y.

[21] Appl. No.: 798,531

[22] Filed: May 19, 1977

[51] Int. Cl.² ............................ G03C 1/76; G03C 1/52
[52] U.S. Cl. ................................... 96/68; 96/75; 96/86 P; 96/86 R; 96/91 R; 96/91 D; 96/91 N; 96/115 R; 96/33
[58] Field of Search ............ 96/68, 86 P, 86 R, 75, 96/91 R, 91 D, 91 N, 115 R, 33

[56] References Cited

U.S. PATENT DOCUMENTS

| | | | |
|---|---|---|---|
| 3,522,042 | 7/1970 | Borchers et al. | 96/91 D |
| 3,544,323 | 12/1970 | Hwang | 96/91 D |
| 3,652,504 | 3/1972 | Sayigh et al. | 96/68 |
| 3,899,332 | 8/1975 | Traskos | 96/68 |
| 3,905,815 | 9/1975 | Bonham | 96/86 P |
| 4,008,084 | 2/1977 | Ikeda et al. | 96/86 P |

Primary Examiner—Won H. Louie, Jr.

[57] ABSTRACT

A method for producing a water developable lithographic printing plate which comprises treating at least one surface of a metal sheet substrate with a layer of a lithographically suitable, light sensitive, water soluble substance and subsequently coating the thus treated base sheet with an upper layer of a water insoluble, ink receptive, lithographically suitable photosensitive composition. Said photosensitive layers must be either both positive working or both negative working. Upon imagewise exposure through a mask by standard methods the exposed areas of said upper photosensitive composition are alternatively characterized as either water permeable or water impermeable and the unexposed areas are alternatively water impermeable or water permeable as opposed to the exposed areas. Upon said imagewise exposure, the exposed lower level areas in a negative system are rendered water insoluble whereas the exposed lower level areas in a positive system are rendered more water soluble than the unexposed areas.

20 Claims, No Drawings

WATER DEVELOPABLE LITHOGRAPHIC PRINTING PLATE HAVING DUAL PHOTOSENSITIVE LAYERING

BACKGROUND OF THE INVENTION

This invention relates to a novel method for the production of presensitized lithographic printing plates and to the novel lithographic printing plates produced thereby. More particularly this invention relates to a novel method of producing aluminum based photosensitive lithographic printing plates which comprises coating at least one surface of an aluminum base sheet the a layer of a lithographically suitable light sensitive, water soluble substance and finally applying to said coated surface an upper layer of a water insoluble and ink receptive lithographically suitable light sensitive composition to yield the desired photosensitive lithographic printing plates.

Heretofore it has been a problem in the art to produce a more ecologically acceptable lithographic printing plate and a method for its development. It is known to produce such plates which require the use of various chemical developing agents which must be discarded after use, typically through community waste removal facilities. Such developers are costly to purchase and disposal through sanitary systems is undesirable. By the instant invention a lithographic printing plate is produced which is developable by ordinary tap water which is both inexpensive and ecologically acceptable.

DESCRIPTION OF THE PRIOR ART

The prior art teaches the use of certain water soluble, diazo type compositions in the manufacture of lithographic printing plates which become water insoluble upon imagewise exposure to ultraviolet radiation by standard techniques. This method does allow removal of non-exposed areas by development with water. However, the images thus formed are exceedingly frail and cannot withstand the strain of prolonged printing. Hence, plates made according to this procedure require that an ink receptive lacquer or other similar coating be applied to the image area after development and it is this coating which actually prints the desired image and not the diazo. It is important to note that these lacquers also pollute their rinse water. One example of such a water soluble diazo system is described in U.S. Pat. No. 3,179,518 issued to Sus, et al.

Other attempts include use of a water soluble diazo and a water soluble resin composition which is rendered water insoluble upon exposure by standard methods,. However, images produced by this procedure are not ink receptive and therefore not useful for the manufacture of lithographic printing plates. The instant invention relates solely to water insoluble, ink receptive lithographic photosensitizer-resin compositions which are employed in the top coating.

SUMMARY OF THE INVENTION

Heretofore in the production of commercially acceptable presensitized lithographic printing plates which did not require a subsequent lacquer application to the imaged plate areas, it had been necessary to employ photosensitive compositions which could not be developed by ordinary tap water. Plates manufactured according to these methods could only be developed by means of costly, specialized, and environment polluting chemical agents.

The present invention provides an improved lithographic printing plate which may be satisfactorily developed by use or ordinary tap water which is both inexpensive and environmentally acceptable. By the instant invention it has been found that a satisfactory plate which meets these criteria may be produced by first applying a layer of a lithographically suitable, light sensitive, water soluble substance to the surface of a metal sheet substrate and subsequently coating the thus treated substrate with an upper layer of a photosensitive composition which comprises a water insoluble lithographic photosensitizer and a water insoluble resin. The lithographic photosensitizers useful in forming the layered compositions of this invention may be either positive working or negative working, however the upper and lower layers must be either both positive working or both negative working. This upper level coating composition is characterized as water insoluble, ink receptive, and alternatively either water permeable or water impermeable. Water permeability means the composition is insoluble in water, yet water may filter through the composition. In a negative working system, the upper coating is initially water permeable and upon imagewise exposure through a suitable mask by methods known to the skilled worker the exposed areas are rendered water impermeable and remain ink receptive. In such a negative working system the lower layer is initially water soluble but is rendered water insoluble at the exposed areas while remaining water soluble at the unexposed areas. Therefore, upon washing an imagewise exposed plate with water, the water permeates the negative working photosensitive composition at the unexposed non image area, and reaches and dissolves the water soluble unexposed photosensitive substance under the non image area. These areas which lack adequate foundation may be quickly and easily swept away by a combination of water and a slight rubbing action. Since the imaged areas were rendered non-water permeable upon exposure, water could not reach the firm foundation of the now water insoluble substance beneath the image areas. These areas are therefore not undermined nor lifted away. The water insolubility of the lower image areas adds resistance to the undesirable loosening of the image areas. The imaged areas are thus ink receptive and the bare metal substrate which coincided with the removed non-image areas is by its nature ink repelling. The result is a commercially satisfactory lithographic printing plate.

In a positive working system the photosensitive upper layer is initially water impermeable and upon exposure is rendered water permeable at the exposed areas and remains water impermeable at the unexposed areas. However, in a positive working system the lower layer is also initially water soluble, but upon imagewise exposure the exposed areas are rendered more water soluble than the unexposed areas. As a result, water filters through the exposed areas of the upper level and dissolves the now extremely water soluble areas at the corresponding lower layer quickly. Even though the non exposed areas of the lower layer are also water soluble, water does not permeate through the corresponding non exposed upper layer. Therefore, no significant amount of the non exposed lower layer is dissolved since water is prevented from reaching it by permeation through the upper layer and a quick dissolution of neighboring exposed areas impedes the availability of undermining water from these areas.

It is therefore an object of the present invention to provide a commercially acceptable lithographic printing plate which may be developed by using ordinary tap water.

It is a further object of the present invention to provide a commercially acceptable lithographic printing plate which may be developed by using ordinary tap water and does not require the subsequent application of a lacquer or similar substance to the developed image.

It is another object of the present invention to provide a commercially acceptable lithographic printing plate which does not require the use of expensive and ecologically objectionable chemicals for development.

These and other objects of the instant invention will be in part discussed and in part apparent upon consideration of the detailed description of the preferred embodiment as provided hereinafter.

DETAILED DESCRIPTION OF THE PREFERRED EMBODIMENT

As hereinbefore mentioned, the present invention provides for a commercially acceptable, water developable, lithographic printing plate.

As the first step in the production of the lithographic printing plate, a sheet metal substrate, preferably aluminum and the alloys thereof, especially those aluminum compositions suitable for the manufacture of lithographic printing plates such as Alcoa 3003 and Alcoa 1100, which may or may not have been pre-treated by standard graining and/or etching and/or anodizing techniques as are well known in the art and also may or may not have been treated with a composition suitable for use as an interlayer for lithographic plates is coated with a layer of a lithographically suitable, light sensitive, water soluble substance. Said coated substrate is then treated with a stratum of a composition which comprises a water insoluble lithographic photosensitizer and a water insoluble resin. Said upper layer composition is characterized as water insoluble, ink receptive and alternatively water permeable or water impermeable prior to exposure to ultraviolet or actinic radiation. The upper layer composition is preferably not a film former which would impede water permeability. In a negative working system, upon imagwise exposure through a mask by methods known to the skilled worker, the aforementioned top layer substance which was initially water permeable is rendered water impermeable at the exposed areas while remaining water permeable at the unexposed areas. This is true only for negative working systems. In a positive working system the upper coating is initially water impermeable and upon exposure the unexposed areas will remain water impermeable and the exposed areas are rendered water permeable.

In a negative working system the upper layer is comprised of a water insoluble negative acting lithographic photosensitizer mixed with a water permeable, oleophilic, water insoluble resin. The resulting composition is also photosensitive, water permeable, oleophilic and water insoluble. After exposure to ultraviolet or actinic radiation the photoensitizer binds more closely with the resin and the composition is rendered water impermeable.

In a positive working system the upper layer is comprised of a water insoluble, water impermeable positive acting lithographic photosensitizer mixed with a water permeable, oleophilic, water insoluble resin. The resulting composition is also oleophilic and water insoluble but the photosensitizer closely binds to the resin and the resulting composition is therefore water impermeable. After exposure, as above, the photosensitizer becomes water permeable, rendering the overall composition water permeable at the exposed areas.

An exposed plate is developed by rinsing with water, with or without scouring. As a result, the water permeable areas allow water to filter through to the water soluble areas in the level thereunder thus causing dissolution of the lower substance and undermining the water permeable areas of the upper coating which are now loosened and washed away. At the water impermeable areas an ink receptive image remains which can be employed as a lithographic printing plate.

Standard metal substrate pretreatments include electrolytically anodizing in sulfuric, chromic, hydrochloric and/or phosphoric acids or electrolytically etching in hydrochloric or phosphoric acid, and chemical or mechanical graining by methods which are all known to the skilled worker.

Interlayer compositions employable in the practice of this invention include those which may be applied as aqueous solutions, such as aqueous solutions of alkali metal silicate, such as sodium silicate, silicic acid, the Group IV-B metal fluorides, the alkali metal salts or the acids thereof, polyacrylic acid, the alkali metal salts or the acids thereof, the alkali zirconium fluorides, such as potassium zironcium hexafluoride, or hydrofluozirconic acid which are applied in concentrations of 0.5 to 20% by volume.

It has been found in the practice of the instant invention that satisfactory results are obtained when the lower level photosensitive substance comprises a water soluble, minimally or non-organic solvent soluble, lithographically suitable photosensitizer which may or may not be mixed with a water soluble resin, dissolved in water or a combination of water and a water miscible organic solvent.

Water miscible organic solvents useable in the context of the present invention include those having a boiling point of up to 250° F, preferably up to 212° F and most preferable between 50° and 150° F. These include: methanol, ethanol, isopropyl alcohol, acetone, methyl ethyl ketone and methyl cellosolve.

Water soluble photosensitizers employable as part of the invention include:
  4-diazo-diphenylamine sulfate
  1-diazo-4-N,N-dimethylamino-benzene zinc chloride
  1-diazo-4-N,N-diethylamino-benzene zinc chloride
  1-diazo-4-N-ethyl-N-hydroxyethylamino-benzene ½ zinc chloride
  1-diazo-4-N-Methyl-N-hydroxyethylamino-benzene ½ zinc chloride
  1-diazo-2,5-diethoxy-4-benzoylamino-benzene, ½ zinc chloride
  1-diazo-4-N-benzylamino-benzene, ½ zinc chloride
  1-diazo-4-N,N-dimethylamino-benzene borofluoride
  1-diazo-4-morpholino-benzene, ½ zinc chloride
  1-diazo-4-morpholino-benzene-borofluoride
  1-diazo-2,5-dimethoxy-4-p-tolylmercaptobenzene, ½ zinc chloride
  1-diazo-2-ethoxy-4-N,N-dimethylaminobenzene, ½ zinc chloride
  p-diazo-dimethyl aniline, ½ zinc chloride
  1-diazo-4-N,N-diethylamino-benzene, ½ zinc chloride
  1-diazo-2,5-dibutoxy-4-morpholino-benzene sulfate 1-diazo-2,5-diethoxy-4-morpholino-benzene, ½ zinc chloride 1diazo-2,5-dimethoxy-4-morpholino-benzene, zinc chloride 1-diazo-2,5-diethoxy-4-morpholino-benzene, ½ zinc chloride 1-diazo-2,5-diethoxy-4-morpholino-benzene-borofluoride 2-diazo-1-naphthol-5-sulfonic acid, sodium salt 1-diazo-4-N,N-diethylamino-benzene, borofluoride 1-diazo-2,5-diethoxy-4-p-tolylmercapto-benzene, ½ zinc chloride 1-diazo-3-ethoxy-4-methyl-N-benzylamino-benzene, ½ zinc chloride 1-diazo-3-chloro-4-N,N-diethylamino-benzene, ½ zinc chloride 1-diazo-3-methyl-4-pyrrolidino-benzene chloride, zinc chloride 1-diazo-3-methyl-4-pyrrolidino-benzene-borofluoride 1-diazo-2-chloro-4-N,N-dimethylamino-5-methoxy-benzene, borofluoride 1-diazo-3-methoxy-4-pyrrolidino benzene, zinc chloride condensation product of 4-diazo-diphenylamine sulfate and formaldehyde zinc chloride Water soluble resins which may comprise the bottom layer as previously described may include, polyvinyl pyrrolodone, polyvinyl alcohols, polyacrylomides and copolymers, synthetic gums such as, starabic, dextrines, natural gums such as, gum arabic and hydroxyethyl cellulose gum.

When a water soluble resin is included as part of the lower level composition the ratio of photosensitizer to resin may broadly range from 100:1 to 1:100 parts by weight.

When a water miscible organic solvent is employed as part of the solution which comprises the lower coating layer, the amount of organic solvent included may be up to that amount which causes a precipitate to form when added to an aqueous solution of the photosensitive substance employed in the lower level.

In a preferred embodiment, the ratio of water to organic solvent may be from about 1:9 to about 9:1 parts by weight. A most preferred ratio is 1:1 parts by weight.

Development speed may be controlled by the relative amounts of water and organic solvent employed. When a greater proportion of water is employed a more continuous film of the lower level substance is formed upon drying which provides stronger bonding to the substrate but a thusly produced plate requires a longer development time. If a greater proportion of organic solvent is used a more discontinuous film of lower level substance is formed upon drying which does not bond as strongly to the substrate but allows quicker development.

A balance of these factors must be selected according to the specific characteristics desired.

The lower level substance is applied to the substrate at a coating weight of from about 5 to about 200 mg/sq.ft., preferably from about 10 to about 100 mg/sq.ft., and most preferably from about 25 to about 60 mg/sq.ft.

Water permeable oleophilic resins usable in the upper coating substance include, epoxy resins (such as, Epon 1031, 1001-1009-Shell Oil Company); polyurethane (such as Goodrich's Estane Series 5714, 5715); polyester (for example, DV 521 available from Polychrome Corp.); formvar (such as 12/85 available from Monsanto); urethanes of low molecular weight (such as DV 53, DV 532 available from Polychrome Corp.); butryl resins (commercially available product of Monsanto); polyox (polyethylene oxide series, available from Union Carbide); and polyvinyl hydrogen phthalate.

The water insoluble photosensitive compositions which may be satisfactorily employed in forming the upper layer of this invention are those which are lithographically suitable and are actinic and for ultraviolet light reactive. The photosensitive compositions which may be used as part of this invention are those which are negative or positive acting and include such negative acting photosensitive agents as the aromatic diazo compounds such as the reaction product of paradiazo diphenyl amine-para-formaldehyde condensate and 2-hydroxy-4-methoxy benzophenone sulfonic acid; and the azidopyrenes, for example, 1-azido-pyrene, 6-nitro-1-azidopyrene, 1,6-diazidopyrene, 1,8-diazido-pyrene, 1-propionyl-6-azidopyrene, 1-acetyl-6-azidopyrene, 1-n-butyryl-6-azidopyrene, 1-n-propionyl-8-bromo-6-azidopyrene; and 8-n-propionyl-1,6-diazidopyrene; and such positive acting photosensitive agents as aromatic diazo-oxide compounds, for example, benzoquinone diazides, naththoquinone diazides, and polyacetals which depolymerize under ultraviolet radiation, polymonochloroacetaldehyde, polypropionaldehyde, poly-n-butyraldehyde, poly-cyanoacetaldehyde, poly-B-cyanopropionaldehyde, polycyano-pentaldehyde, poly-cyano-valeraldehyde, poly-isobutyraldehyde, poly-valeraldehyde, poly-heptaldehyde. The most satisfactory photosensitive agent may be selected by the skilled worker, depending upon the results sought to be achieved.

The optimum proportion of each ingredient and selection of particular compositions naturally depends on the specific properties desired in the final lithographic plate. Although there is virtually an infinite range to the ratio of the amount of photosensitizer to resin in the upper layer, a practical, operable ratio of sensitizer to resin in the top coating is from about 1 to 10 parts by weight sensitizer to from about 50 to 1 part by weight resin. A preferred ratio is from about 1 to 5 parts by weight sensitizer to from about 10 to 1 part be weight resin. A most preferred ratio is from about 1 to 3 parts by weight sensitizer to from about 4 to 1 part by weight resin.

The coating weight of the photosensitizer-resin upper level composition on the plate is from about 5 to about 300 mg/sq.ft., with a preferred range of from about 35 to about 200 mg/sq. ft., and a most preferred range of from about 50 to about 100 mg/sq.ft.

A thusly produced plate, upon imagewise exposure by methods well known to the skilled worker may be developed by use of a water rinse, with or without physical rubbing. Operable development times range from 5 seconds upwards depending on the composition of each level and the size of the plate. Preferably development time ranges from about 5 seconds to about 1 minute.

The following examples are provided to illustrate the operation of the present invention and in no way limits its scope.

EXAMPLE 1

Two sheets of pumice grained, grade 3003 (Alcoa) aluminum alloy, A and B, were coated with a water soluble negative active diazonium resin salt namely, para diazo diphenylamine zinc chloride salt condensed with para formaldehyde. Plate A was treated with a 2% solution of the above condensation product in water to arrive at a dried coating weight of 40 mg/sq.ft. via a dip coating method. Plate B was treated with a 2% solution of the above condensation product in a 50% water, 50% methanol solution to again arrive at a dried coating weight of 40 mg/sq.ft. via a dip coating method.

Both sheets were then coated with a composition consisting of, 1 part by weight water insoluble diazo resin; 2 parts by weight Epon 1031 resin; 0.1 part by weight basic blue dye, in methyl cellosolve and dried to a coating weight of 70 mg/sq.ft.

Upon exposure of the thus produced plates with a standard NuArc ultraviolet light source for 2 minutes, using a conventional negative, both plates were subsequently developed with ordinary tap water.

Plate A had to be wetted for 30 seconds and vigorously rubbed with a cotton pad before the unexposed areas began to lift. Plate B was wetted down with tap water for 5 seconds and only minimal rubbing with a cotton pad was required for complete and easy removal of the non image areas, resulting in a fully developed printing plate.

This example illustrates the variance in development times which can be achieved within the context of the present invention.

EXAMPLE 2

A plate was produced according to the procedure of plate B in Example 1, except the methanol was replaced by methyl ethyl ketone. Similar results were obtained.

EXAMPLE 3

A plate was produced according to the method of plate B in Example 1, except 2% polyvinyl alcohol was added to the bottom coating to enhance water developability. Similar results were obtained.

EXAMPLE 4

A plate was produced according to the method of plate B in Example 1, except the water soluble light sensitive component was 1-diazo-4-N-ethyl-N-benzylamino-benzene ½ zinc chloride. Similar results were obtained.

EXAMPLE 5

A sheet of Alcoa grade 1100 lithographic aluminum was chemically etched in a 10% solution of trisodium phosphate, maintained at 180° F, for 1 minute. A hydrophilic layer of sodium silicate was subsequently applied. Thereafter a water soluble coating composition comprising, 1.2% p-diazodimethyl aniline ½ zinc chloride; 1% phosphoric acid in a solvent mixture of 40% water, 40% isopropyl alcohol, 20% methyl cellosolve was applied via a whirler and dried to a coating weight of 60 mg/sq.ft. The dried coating displayed a dull, matte appearance after drying due to the inclusion of the isopropyl alcohol and methyl cellosolve in the coating mixture to achieve the desired discontinuous film property.

A subsequent layer was applied which comprised 1 part by weight of a water insoluble diazo resin; 1 part by weight of a polyester resin DV 521 (commercially available from Polychrome Corp.); 1 part by weight Epon 1031 resin (commercially available from Shell) dissolved in a 50% methyl cellosolve, 50% methyl cellosolve acetate solvent system and dried to a coating weight of 80 mg/sq.ft.

After exposure through a conventional light source using a negative transparency for 2 minutes, the unexposed areas were easily removed after being wetted down with tap water for 10 seconds.

A commercially acceptable lithographic printing plate was obtained.

EXAMPLE 6

The procedure of Example 5 was followed except the water soluble diazo was 1-diazo 3 methyl-4-pyrrolidine-benzene chooride zinc chloride salt of 360 molecular weight.

Similar results were obtained.

EXAMPLE 7

The procedure employed to produce plate B of Example 1 was followed except the water soluble photosensitizer was a positive acting water soluble diazo namely 2-diazo-1-naphthal-5-sulfonic acid sodium salt and the top coating comprised 1 part by weight of a positive acting water insoluble diazo in conjunction with 2 parts by weight of a phenol formaldehyde resin (2620 bakelite commercially available from Union Carbide) at a final dried coating weight of 85 mg/sq.ft. This coating resulted in the easy removal of the exposed areas, with ordinary tap water, after exposure through a positive transparency.

It is, of course, to be understood that the foregoing disclosure is intended to illustrate the invention and that numerous changes can be made in the conditions and proportions set forth without departing from the scope of the invention as disclosed and defined in the claims appended hereafter.

We claim:

1. A water developable lithographic printing plate which comprises a metal sheet substrate having coated thereon a layer of a water soluble, lithographically suitable, light sensitive negative working aromatic diazo substance and having applied to said layer, a second layer of a water insoluble, ink receptive, photosensitive composition which comprises a water permeable, water insoluble, oleophilic resin and a lithographically suitable negative working photosensitizer selected from the group consisting of the reaction product of the paradiazo diphenylamine-paraformaldehyde condensate with 2-hydroxy-4-methoxy benzophenone sulfonic acid, and the azido pyrenes.

2. The lithographic printing plate of claim 1 wherein said metal sheet substrate is comprised of aluminum.

3. The printing plate of claim 2 wherein said aluminum sheet substrate has been anodized.

4. The printing plate of claim 2 wherein said aluminum sheet substrate has been grained.

5. The printing plate of claim 1 wherein said metal sheet substrate has applied thereto, between the upper surface of said substrate and the water soluble, lithographically suitable, light sensitive substance, an interlayer composition which comprises a substance selected from the group consisting of alkali metal silicate, silicic acid, the Group IV B metal fluorides, the alkali metal salts or the acids thereof, polyacrylic acid, the alkali zirconium fluorides and hydrofluozirconic acid.

6. The printing plates of claim 1 wherein said oleophilic resin comprises a composition selected from the group consisting of epoxy resins; polyurethane; polyester; formvar; urethane; butryl resins; polyethylene oxides and polyvinyl hydrogen phthalate.

7. The printing plate of claim 1 wherein the coating weight of water soluble light sensitive substance is from about 5 to about 200 mg/sq.ft. and the coating weight of the lithographically suitable photosensitizer-oleophilic resin composition is from about 5 to about 300 mg/sq.ft.

8. The printing plate of claim 1 wherein the ratio of lithographically suitable photosensitizer to oleophilic resin is from about 1 to about 10 parts photosensitizer to from about 50 to about 1 part by weight oleophilic resin.

9. The lithographic printing plate of claim 1 wherein said water soluble, lithographically suitable light sensitive substance is mixed with a non-light sensitive resin which comprises a composition selected from the group consisting of, polyvinyl pyrollodone; polyvinyl alcohols; polyacrylomides and copolymers; synthetic gums and natural gums.

10. The printing plate of claim 1 wherein the water soluble, lithographically suitable photosensitive substance is a composition selected from the group consisting of,
 4-diazo-diphenylamine sulfate
 1-diazo-4-N,N-dimethylamino-benzene zinc chloride
 1-diazo-4-N,N-diethylamino-benzene zinc chloride
 1-diazo-4-N-ethyl-N-hydroxyethylamino-benzene, ½ zinc chloride
 1-diazo-4-N-methyl-N-hydroxyethylamino-benzene ½ zinc chloride
 1-diazo-2,5-diethoxy-4-benzoylamino-benzene, ½ zinc chloride
 1-diazo-4-N-benzylamino-benzene, ½ zinc chloride
 1-diazo-4-N,N-dimethylamino-benzene borofluoride
 1-diazo-4-morpholino-benzene, ½ zinc chloride
 1-diazo-4-morpholino-benzene-borofluoride
 1-diazo-2,5-dimethoxy-4-p-tolylmercaptobenzene, ½ zinc chloride
 1-diazo-2-ethoxy-4-N,N-dimethylaminobenzene, ½ zinc chloride
 p-diazo-dimethyl aniline, ½ zinc chloride
 1-diazo-4-N,N-diethylamino-benzene, ½ zinc chloride
 1-diazo-2,5-dibutoxy-4-morpholino-benzene sulfate
 1-diazo-2,5-diethoxy-4-morpholino-benzene, ½ zinc chloride
 1-diazo-2,5-dimethoxy-4-morpholino-benzene, zinc chloride
 1-diazo-2,5-diethoxy-4-morpholino-benzene, ½ zinc chloride
 1-diazo-2,5-diethoxy-4-morpholino-benzene-borofluoride
 1-diazo-4-N,N-diethylamino-benzene, borofluoride
 1-diazo-2,5-diethoxy-4-p-tolylmercapto-benzene, ½ zinc chloride
 1-diazo-3-ethoxy-4-N-methyl-N-benzylamino-benzene, ½ zinc chloride
 1-diazo-3-chloro-4-N,N-diethylamino-benzene, ½ zinc chloride
 1-diazo-3-methyl-4-pyrrolidino-benzene chloride, zinc chloride
 1-diazo-3-methyl-4-pyrrolidino-benzene-borofluoride
 1-diazo-2-chloro-4-N,N-dimethylamino-5-methoxy-benzene, borofluoride
 1-diazo-3-methoxy-4-pyrrolidino benzene, zinc chloride
 condensation product of 4-diazo-diphenylamine sulfate and formaldehyde zinc chloride.

11. The printing plate of claim 1 wherein said water soluble, lithographically suitable, light sensitive substance is dissolved in a solvent selected from the group consisting of water, and water mixed with a water miscible organic solvent having a boiling point of up to 250° F.

12. The printing plate of claim 11 wherein said water miscible organic solvent is comprised of a composition selected from the group consisting of, methanol, ethanol, isopropyl alcohol, acetone, methyl ethyl ketone and methyl cellosolve.

13. A method of producing a lithographic printing plate which comprises first applying a water soluble, lithographically suitable, light sensitive aromatic diazo substance as a first layer to at least one surface of a metal sheet substrate and secondly applying to said layer, a second layer of a water insoluble, ink receptive photosensitive composition which comprises a water permeable, water insoluble, oleophilic resin and a lithographically suitable photosensitizer selected from the group consisting of the reaction product of the paradizo diphenylamineparaformaldehyde condensate with 2-hydroxy-4-methoxy benzophenone sulfonic acid, the azido pyrenes, aromatic diazo oxides, polyacetals which depolymerize under ultraviolet radiation, polymonochloroacetaldehyde, polypropionaldehyde, poly-n-butyraldehyde, poly-cyanopentaldehyde, polycyanovaleraldehyde, poly-n-butyraldehyde, poly-isobutyraldehyde, polyvaleraldehyde and polyheltaldehyde, said water soluble, lithographically suitable, light sensitive substance and said water insoluble, ink receptive photosensitive composition are characterized as being either both positive working or both negative working.

14. The method of claim 13, wherein said water soluble, lithographically suitable, light sensitive substance comprises a lithographically suitable photosensitizer, which is optionally mixed with a water soluble, non light sensitive resin, in a solvent selected from the group consisting of water and water mixed with a water miscible organic solvent having a boiling point of up to 250° F.

15. The printing plate produced according to the method of claim 13.

16. The printing plate produced according to the method of claim 14.

17. The lithographic printing plate of claim 1 wherein the water insoluble photosensitizer is the reaction product of the paradiazo diphenylamine-paraformaldehyde condensate with 2-hydroxy-4-methoxy benzophenone sulfonic acid.

18. A water developable lithographic printing plate which comprises a metal sheet substrate having coated thereon a layer of a water soluble, lithographically suitable, light sensitive positive working aromatic diazo composition and having applied to said layer, a second layer of a water insoluble, ink receptive, photosensitive composition which comprises a water permeable, water insoluble, oleophilic resin and a lithographically suitable water insoluble positive working photosensitizer selected from the group consisting of aromatic diazo oxides, polyacetals which depolymerize under ultraviolet radiation, polymonochloroacetaldehyde, polypropionaldehyde, poly-n-butyraldehyde, poly-cyano-pentaldehyde, polycyanovaleraldehyde, poly-n-butyraldehyde, poly-isobutyraldehyde, polyvaleraldehyde and polyheptaldehyde, whereby said photosensitive composition is characterized as water impermeable prior to exposure to ultraviolet or actinic radiation and water permeable after such exposure.

19. The printing plate of claim 18 wherein the water soluble positive working aromatic diazo composition is 2-diazo-1-naphthol-5-sulfonic acid sodium salt.

20. The printing plate of claim 19 wherein the water insoluble photosensitizer is a diazo oxide composition.

* * * * *